(12) United States Patent
Cheon

(10) Patent No.: US 6,194,774 B1
(45) Date of Patent: Feb. 27, 2001

(54) INDUCTOR INCLUDING BONDING WIRES

(75) Inventor: Dang-Bin Cheon, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/266,247

(22) Filed: Mar. 10, 1999

(51) Int. Cl.[7] .......................... H01L 29/80; H01L 23/48; G02B 6/26; H03F 3/60

(52) U.S. Cl. .......................... 257/531; 257/784; 257/728; 257/786; 257/724; 257/725; 257/528; 330/269; 330/206; 330/5; 330/286; 336/200

(58) Field of Search .................... 257/531, 784, 257/786, 728, 281, 379, 401, 275, 277, 236, 536, 538, 528, 725, 724; 333/206, 5, 269, 202, 286; 336/200

(56) References Cited

U.S. PATENT DOCUMENTS

| | | | |
|---|---|---|---|
| 3,614,554 | * 10/1971 | Shield et al. | 257/531 |
| 4,446,445 | * 5/1984 | Apel | 330/269 |
| 5,024,966 | * 6/1991 | Dietrich et al. | 432/60 |
| 5,173,672 | * 12/1992 | Heine | 333/206 |
| 5,221,984 | * 6/1993 | Furuyama et al. | 359/154 |
| 5,321,299 | * 6/1994 | Ohkawa et al. | 257/528 |
| 5,376,902 | * 12/1994 | Bockelman et al. | 333/5 |
| 5,378,869 | * 1/1995 | Marrs et al. | 219/121.71 |
| 5,394,008 | * 2/1995 | Ito et al. | 257/666 |
| 5,519,233 | * 5/1996 | Fukasawa | 257/275 |
| 5,572,180 | * 11/1996 | Huang et al. | 336/200 |
| 5,576,680 | * 11/1996 | Ling | 336/200 |
| 5,639,989 | * 6/1997 | Higgins, III | 174/35 MS |
| 5,710,068 | * 1/1998 | Hill | 438/171 |
| 5,736,749 | * 4/1998 | Xie | 257/3 |
| 5,744,869 | * 4/1998 | Root | 257/778 |
| 5,767,563 | * 6/1998 | Imam et al. | 257/531 |
| 5,793,096 | * 8/1998 | Yu et al. | 257/531 |
| 5,849,355 | * 12/1998 | McHenry | 333/167 |
| 5,877,667 | * 3/1999 | Wollesen | 336/200 |
| 5,880,517 | * 3/1999 | Petrosky | 257/577 |
| 5,886,393 | * 3/1999 | Merrill et al. | 257/531 |
| 5,912,997 | * 6/1999 | Bischel et al. | 385/15 |
| 5,920,067 | * 7/1999 | Cresswell et al. | 250/306 |
| 5,929,636 | * 7/1999 | Torok et al. | 324/252 |
| 5,966,063 | * 10/1999 | Sato et al. | 336/200 |
| 5,973,567 | * 10/1999 | Heal et al. | 330/286 |

\* cited by examiner

Primary Examiner—Alexander O. Williams
(74) Attorney, Agent, or Firm—Skjerven Morrill Macpherson LLP; David Millers

(57) ABSTRACT

An inductor includes a semiconductor substrate, pairs of pads formed on the semiconductor substrate at predetermined intervals with the pads in a pair spaced apart a predetermined distance, bonding wires connect the pads constituting the corresponding pairs of pads, and metal lines connect pads among the pairs to other pads to form a current path for the inductor. Since the inductor uses bonding wire which has low resistance and can reduce the contact area with chips, the inductor has few parasitic components and a high quality factor in nearly all frequency regions.

14 Claims, 3 Drawing Sheets

INDUCTOR INCLUDING BONDING WIRES

BACKGROUND OF THE INVENTION

1. Field of the Invention

The present invention relates to an inductor, and more particularly, to a high-quality inductor which can be built using bonding wires attached to a substrate.

2. Description of the Related Art

A conventional on-chip inductor has various patterns, including a spiral inductor, a meandering line inductor, pairs of such inductors and the like. Placing metal on top of chips can increase the inductance and mutual inductance of such inductors. However, since an on-chip inductor typically has a large parasitic capacitance with a substrate having a high conductance, e.g., a silicon substrate, the conventional on-chip inductor has a very low quality factor. Also, it is quite difficult to fabricate an on-chip inductor having a high quality factor using conventional integrated circuit manufacturing processes. Accordingly, an on-chip inductor having a high quality factor is sought.

SUMMARY OF THE INVENTION

In accordance with an embodiment of the invention, an inductor includes a substrate such as a silicon or other semiconductor substrate and pairs of pads formed on the substrate at predetermined intervals. The pads in a pair are spaced apart by a predetermined distance. Each pair of pads has an corresponding bonding wire connected between the pads constituting the pair, and metal lines on the substrate connect a pad from each pair of pads to a pad in the next pair so that the pairs of pads, the metal lines, and the bonding wires form a current path.

BRIEF DESCRIPTION OF THE DRAWINGS

The advantages of the present invention will become more apparent by describing an embodiment thereof with reference to the attached drawings in which.

DESCRIPTION OF THE PREFERRED EMBODIMENTS

Figure 1:
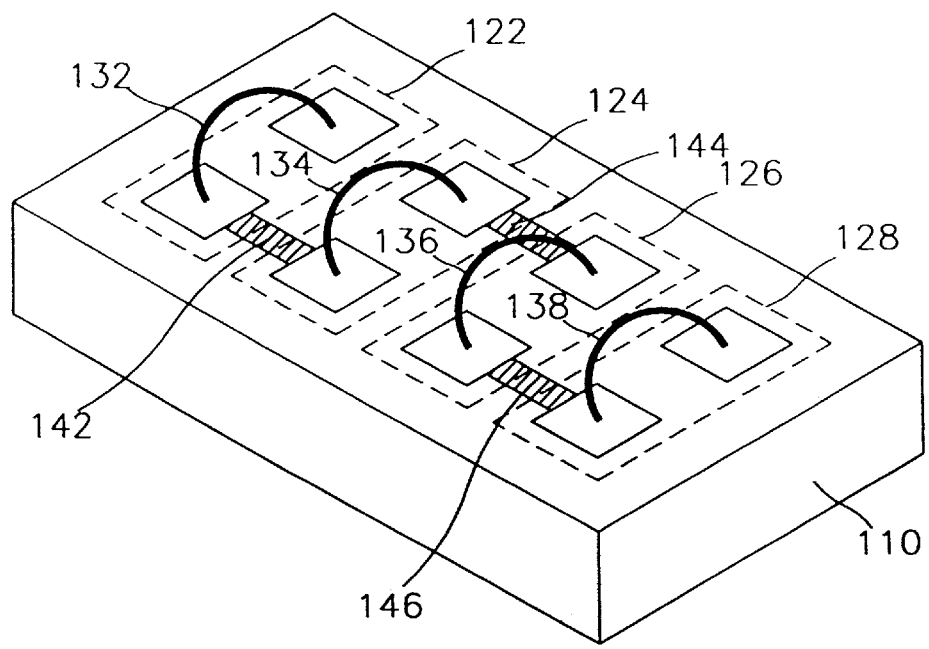
FIG. 1 illustrates an inductor according to an embodiment of the present invention.

Referring to FIG. 1, an inductor according to an embodiment of the present invention includes a semiconductor substrate 110, pairs of pads 122, 124, 126 and 128, bonding wires 132, 134, 136 and 138, and metal lines 142, 144 and 146.

The pairs of pads 122, 124, 126 and 128 are formed on the semiconductor substrate 110 at predetermined intervals. Each of the pairs of pads 122, 124, 126 and 128 includes two pads formed on the semiconductor substrate 110 spaced apart a predetermined distance. Conventional methods, which are well known in semiconductor processing and integrated circuit manufacture, can form a patterned metal layer that includes bonding pad pairs 122, 124, 126 and 128, metal lines 142, 144 and 146, and any other bonding pads or conductive interconnects required in an integrated circuit including the inductor. Typically, the patterned metal layer is on an insulating layer such as an oxide or nitride layer which for the purpose of this document is part of the substrate. Vias through the insulating layer can connect an inductor to other circuitry which may be formed in and on the substrate.

The bonding wires 132, 134, 136 and 138 connect the pads constituting a corresponding pair of pads among the pairs of the pads 122, 124, 126 and 128. The lengths of bonding wires 132, 134, 136, and 138 used to connect pads in pairs 122, 124, 126 and 128 and the predetermined distances between pads in the pairs 122, 124, 126 and 128 affect the areas of the loops that the bonding wires form. Generally, longer bonding wires or longer predetermined distances increase inductance, but the maximum lengths depend on the possible sagging of bonding wires or shifting of bonding wires during a molding process that packages the inductor. The predetermined intervals between pairs of pads are typically as small as possible while still permitting a conventional bonding method to attach bonding wires 132, 134, 136 and 138 to pads 122, 124, 126 and 128. Currently, the minimum center to center separation for bonding pads to which bonding wired can be attached is about 100 $\mu$m. Short intervals increase the inductance between adjacent loops. However, in the general case the number of pairs of pads, the predetermined intervals between pairs, the predetermined distance between pads in a pair, and the length of bonding wires depend on the area available on substrate 110 for the inductor and the required inductance of the inductor.

The metal lines 142, 144 and 146 connect between corresponding pads among the pairs of pads 122, 124, 126 and 128 so that a current path is formed by the pairs of pads 122, 124, 126 and 128 and the bonding wires 132, 134, 136 and 138. In the embodiment of FIG. 1, the pads form two rows, and the metal lines 142, 144 and 146 connect closest neighboring pads in the same row. Metal lines 142, 144, and 146 are typically as narrow as possible to minimize any parasitic capacitance between the metal lines and substrate 210. In a particular embodiment, the widths of lines 142, 144 and 146 depend on the patterning or photolithography employed and/or the current carrying capacity required of the inductor.

Conventional packaging of the inductor protects bonding wires 132, 134, 136 and 138 and other circuit elements.

As described above, in the inductor according to this embodiment of the present invention, the primary parasitic components are restricted to the pads and the metal lines formed on the substrate. Accordingly, minimizing the sizes of the pads and metal lines can give the inductor a high quality factor.

Figure 2:
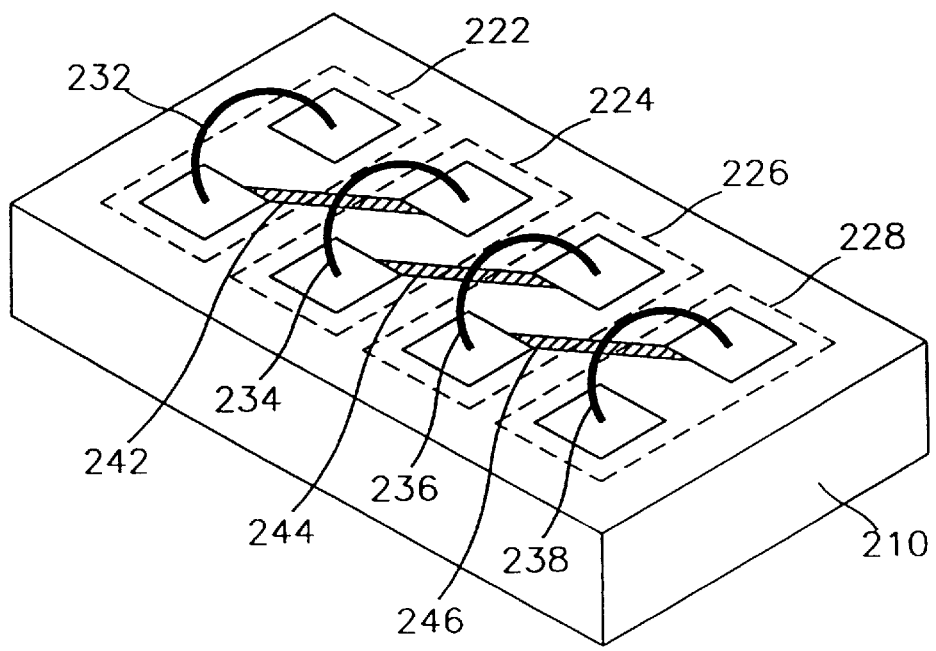
FIG. 2 illustrates an inductor according to another embodiment of the present invention.

FIG. 2 shows an inductor according to another embodiment of the present invention. In FIG. 2, the inductor includes a semiconductor substrate 210, pairs of pads 222, 224, 226 and 228, bonding wires 232, 234, 236 and 238, and metal lines 242, 244 and 246. Pairs of pads 222, 224, 226 and 228; bonding wires 232, 234, 236 and 238; and metal lines 242, 244 and 246 can be formed in the same fashion as described above in regard to pairs of pads 122, 124, 126 and 128; bonding wires 132, 134, 136 and 138; and metal lines 142, 144 and 146, respectively.

The pairs of pads 222, 224, 226 and 228 are on the semiconductor substrate 210 at predetermined intervals. Each of the pairs of pads 222, 224, 226 and 228 includes two pads formed on the semiconductor substrate 210 spaced apart a predetermined distance. Accordingly, the pads form two rows.

Each of bonding wires 232, 234, 236 and 238 connects the pads constituting a corresponding pair of pads among the pairs of the pads 222, 224, 226 and 228.

The metal lines 242, 244 and 246 connect each pair of pads 222, 224, or 226 to the next pair 224, 226, or 228 so that a current path is formed by the pairs of pads 222, 224, 226 and 228 and the bonding wires 232, 234, 236 and 238. In the embodiment of FIG. 2, the metal lines 242, 244 and 246 connect diagonally neighboring pads. That is, each of metal lines 242, 244 and 246 connects a pad from one of the rows of pads to a pad in the other row of pads. This configuration makes the current direction the same in every bonding wire and increases the magnetic flux through the inductor and the overall inductance.

As described above, the inductor according to this embodiment of the present invention can have a high quality factor because the primary components having parasitic capacitance are restricted to the pads.

Figure 3:
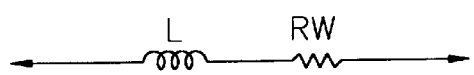
FIG. 3 is an equivalent circuit diagram of a bonding wire shown in FIGS. 1 and 2.
Figure 4:
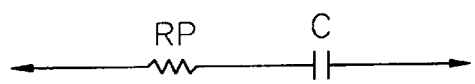
FIG. 4 is an equivalent circuit diagram of a pad shown in FIGS. 1 and 2.

FIG. 3 shows an equivalent model of a bonding wire as shown in FIGS. 1 and 2. The equivalent model of a bonding wire includes an equivalent inductance L and an equivalent resistance RW. FIG. 4 shows an equivalent model of a pad as shown in FIGS. 1 and 2. The equivalent model of a pad includes an equivalent capacitance C and an equivalent resistance RP. A metal line of FIG. 1 or 2 can be consider as a part of an attached pad and/or an associated bonding wire through contributions to the inductance L, the parasitic capacitance C, and the resistances RP and/or RW.

Figure 5:
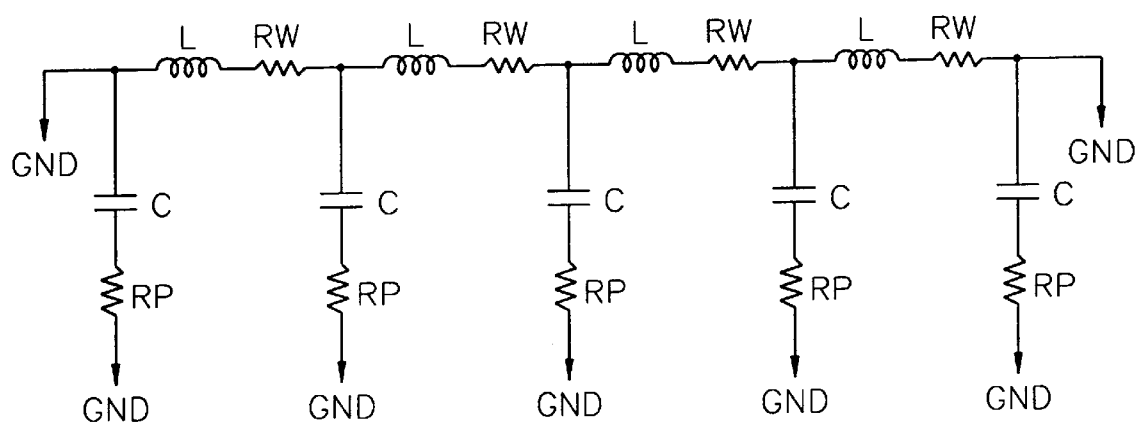
FIG. 5 is an equivalent circuit diagram of the inductors shown in FIGS. 1 and 2.
Figure 6:
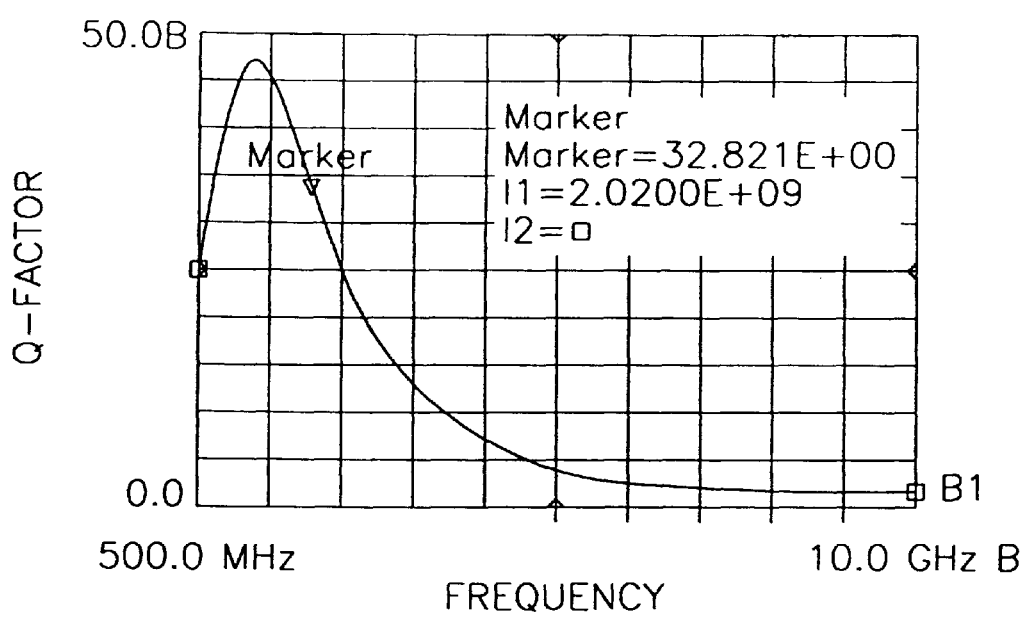
FIG. 6 shows a simulation result of the operation of the inductor shown in FIG. 5.

FIG. 5 shows an equivalent circuit of the inductor shown in FIG. 1 or 2 using the equivalent models shown in FIGS. 3 and 4, and FIG. 6 shows a simulated result of the operation of the inductor shown in FIG. 5. Here, the equivalent inductance L is 0.6 nH/mm and the equivalent resistance RW is 0.0749 Ω/mm, the equivalent capacitance C is 100 fF, and the equivalent resistance RP is 300 Ω.

FIG. 6 shows the quality factor (Q-factor) of an inductor, with a higher quality factor representing a higher quality. As shown in FIG. 6, since the inductor uses bonding wires having low parasitic capacitance and low resistance, the inductor can be incorporated on a chip alone or with an integrated circuit and provide a high quality factor in nearly all frequency regions.

While the present invention has been particularly shown and described with reference to particular embodiments thereof, it will be understood by those skilled in the art that various changes may be effected therein without departing from the spirit and scope of the invention as defined by the appended claims.

What is claimed is:

1. An inductor comprising:
    a substrate;
    a plurality of pairs of pads disposed at intervals on the substrate, each pair of pads including two pads spaced apart a distance;
    a plurality of bonding wires, each bonding wire being connected between the pads constituting a corresponding pair of pads from among the plurality of pairs of the pads; and
    metal lines connecting the pairs of pads so that a current path is formed by the metal lines, the pairs of pads and the bonding wires.

2. The inductor according to claim 1, wherein the metal lines are connected between neighboring pads.

3. The inductor according to claim 1, wherein the metal lines are connected between diagonally neighboring pads.

4. The inductor according to claim 1, wherein the substrate comprises a semiconductor substrate.

5. The inductor according to claim 1, wherein:
    the pairs of pads are arranged so that the pads form a first row and a second row with each pair including one pad in each row; and
    each metal line connects one of the pads in the first row diagonally to one of the pads in the second row.

6. The inductor of claim 1, wherein the metal lines connect the pads so that a current direction is the same in every bonding wire, thereby increasing the magnetic flux through the inductor and the overall inductance.

7. The inductor of claim 1, wherein each of the pads has an area that permits bonding to the bonding wires and minimizes capacitance to provide the inductor with a high quality factor.

8. The inductor of claim 7, wherein each of the metal lines has a width equal to a minimum feature size of an integrated circuit including the inductor.

9. The inductor of claim 1, wherein each of the metal lines has a width equal to a minimum feature size of an integrated circuit including the inductor.

10. An inductor comprising:
    a plurality of pairs of pads on a substrate;
    a plurality of bonding wires, each bonding wire being connected between the pads constituting a corresponding pair of pads from among the plurality of pairs of the pads; and
    a plurality of connectors, each connector electrically connecting a pad from one of the pairs of pads to a pad from an adjacent one of the pairs of pads, wherein the connectors, the pairs of pads and the bonding wires form a current path that serially traverses the bonding wires, and a current along the current path flows in a direction that is substantially the same in all of the bonding wires.

11. The inductor of claim 10, wherein the direction of the current in the bonding wires increases the magnetic flux through the inductor and overall inductance.

12. The inductor of claim 10, wherein the electrical connectors are metal lines.

13. The inductor of claim 12, wherein each of the metal lines has a width equal to a minimum feature size of an integrated circuit including the inductor.

14. The inductor of claim 10, wherein each of the pads has an area that permits bonding to the bonding wires and minimizes capacitance to provide the inductor with a high quality factor.

* * * * *